US011094514B2

(12) United States Patent
Wu

(10) Patent No.: US 11,094,514 B2
(45) Date of Patent: Aug. 17, 2021

(54) ROTATABLE SPUTTERING TARGET

(71) Applicants: OUMEIDA APPLIED MATERIALS TECHNOLOGY CO., LTD., Tainan (TW); WELL AND SHINE PRECISION CO., LTD., New Taipei (TW)

(72) Inventor: I-Sheng Wu, Tainan (TW)

(73) Assignees: OUMEIDA APPLIED MATERIALS TECHNOLOGY CO., LTD., Tainan (TW); WELL AND SHINE PRECISION CO., LTD., New Taipei (TW)

( * ) Notice: Subject to any disclaimer, the term of this patent is extended or adjusted under 35 U.S.C. 154(b) by 0 days.

(21) Appl. No.: 16/228,764

(22) Filed: Dec. 21, 2018

(65) Prior Publication Data
US 2020/0203134 A1    Jun. 25, 2020

(51) Int. Cl.
*H01J 37/34* (2006.01)
*C23C 14/34* (2006.01)

(52) U.S. Cl.
CPC .......... *H01J 37/3429* (2013.01); *C23C 14/34* (2013.01); *H01J 37/342* (2013.01); *H01J 37/3417* (2013.01); *H01J 37/3423* (2013.01); *H01J 37/3435* (2013.01); *H01J 37/3497* (2013.01)

(58) Field of Classification Search
CPC .............. C23C 14/3407; H01J 37/3414; H01J 37/3417; H01J 37/3423; H01J 37/3426
USPC ......................... 204/298.12, 298.21, 298.22
See application file for complete search history.

(56) References Cited

U.S. PATENT DOCUMENTS 6,280,584 B1 * 8/2001 Kumar ................... H02N 13/00
                                                        118/666
6,376,385 B2 * 4/2002 Lilleland ........... H01J 37/32532
                                                        438/710
7,588,668 B2 * 9/2009 Ye ....................... C23C 14/3407
                                                        156/283

(Continued)

FOREIGN PATENT DOCUMENTS

CN      103264231 A    *    8/2013
CN      204550698 U    *    8/2015
JP      10-317133      *    12/1998

OTHER PUBLICATIONS

JP 10-317133 Machine Translation dated Dec. 1998. (Year: 1998).*
Machine Translation CN 103264231 A (Year: 2013).*
Machine Translation CN 204550698 U (Year: 2015).*

*Primary Examiner* — Rodney G McDonald
(74) *Attorney, Agent, or Firm* — Pai Patent & Trademark Law Firm; Chao-Chang David Pai

(57) ABSTRACT

A rotatable sputtering target has a target material, a back tube and a joint piece. The joint piece is disposed between the target material and the back tube. The joint piece has a compressible structure and an electrically and thermally conductive adhesive. Particularly, the compressible structure being a compressible blanket or a compressible sheet has multiple through holes and thus the electrically and thermally conductive adhesive is filled in the through holes and then directly formed between the target material and the back tube. Using the joint piece to joint the target material and the back tube not only maintains the joint strength but also elevates the tolerable power of the rotatable sputtering target, which can increase the sputtering efficiency.

17 Claims, 4 Drawing Sheets

(56) References Cited

U.S. PATENT DOCUMENTS

2006/0272941 A1\* 12/2006 Simpson ............. H01J 37/3435
                                                    204/298.12
2011/0240467 A1\* 10/2011 Itoh .................... C23C 14/3407
                                                    204/298.12

\* cited by examiner

ROTATABLE SPUTTERING TARGET

BACKGROUND OF THE INVENTION

1. Field of the Invention

The present invention relates to a sputtering target, more particularly to a rotatable sputtering target.

2. Description of the Prior Arts

Magnetron sputtering utilizes a magnetic control apparatus to change the movement of the electrons in the plasma via electromagnetic effect and therefore increase the ionization rate and sputtering efficiency. When a planar sputtering target is sputtered by conventional magnetron sputtering, the sputtering will be focused on the surface area that has the strongest tangent magnetic field and cause a track-like erosive surface on the target, which decreases the usage of the planar sputtering target to 35% to 50% during the magnetron sputtering process.

In order to solve the problem occurring on magnetron sputtering the planar sputtering target, a rotatable sputtering target is used. As disclosed in TW 1534283, an uniform erosive surface may be obtained by magnetron sputtering the rotatable sputtering target, which not only improves the usage of the rotatable sputtering target to 70% to 80%, but also exhibits many advantages such as longer lifetime of sputtering target, lower cost, higher process yield and better film quality.

However, the technique of jointing the target material and back tube of the rotatable sputtering target is much more complicated than that of the planar sputtering target. With regard to the prior art, a low-melting-point metal is usually used as a solder and filled in the gap between the target material and back tube of the rotatable sputtering target for jointing.

Because applying pressure on the hollow target material is not easy during bonding, joint strength between the target material and the back tube is weak and the target material is prone to be detached at a certain temperature during the sputtering process. Besides, the back tube, the solder and the target material are made of materials with different coefficients of thermal expansion. Accordingly, during soldering or sputtering, the thermal stress occurs on the interface between the target material and the solder, and between the solder and the back tube as the temperature changes. When the target material becomes thinner after sputtering for a while, the thermal stress will be greater than the strength of the target material and then ruptures the target material.

Furthermore, when the solder solidifies, its volume may shrink, causing shrinking stress. The accumulated heat and stress often make the joint layer detached from the back tube and the target material during the sputtering process. If the detaching area grows to a certain degree, the heat transferring from the target material to the back tube will be dramatically decreased, which causes local overheating on the target material and more uneven thermal stress. Eventually, the target material may crack and break off and thus causes the interruption of the film deposition.

In view of the above problems, two conventional technical means are provided to mitigate the problems of breaking of the target material during the sputtering process.

As disclosed by JP 6301156 and JP 6300734, a material having a coefficient of thermal expansion between the solder and the target material is applied to the interface between the solder and the target material and forms a middle layer for reducing the thermal stress. However, the additional middle layer cannot reduce the risk of detachment between the back tube and the target material, and makes the jointing process more complicated and increases the cost of the rotatable sputtering target.

On the other hand, as disclosed by TW 555874, a compressible joint material is used to replace the solder for jointing the target material and the back tube. Nevertheless, the joint piece with loose material cannot transfer the heat accumulated on the target material during the sputtering process, which deteriorates the sputtering power tolerance and shorten the lifetime of the rotatable sputtering target.

SUMMARY OF THE INVENTION

According to the aforementioned shortcomings, one objective of the present invention is to simplify the process of producing the rotatable sputtering target. Another objective of the present invention is to both maintain the joint strength between the target material and the back tube and increase the sputtering power tolerance during the sputtering process, thereby prolonging the lifetime and improving the sputtering efficiency of the rotatable sputtering target.

To achieve the aforementioned objectives, the present invention provides a rotatable sputtering target. The rotatable sputtering target contains a target material, a back tube and a joint piece. The joint piece is disposed between the target material and the back tube in order to tightly joint the target material and the back tube, and contains a compressible structure and an electrically and thermally conductive adhesive. Particularly, the compressible structure of the joint piece has multiple through holes and the electrically and thermally conductive adhesive is filled into the through holes and is formed between the target material and the back tube. The compressible structure is a compressible blanket or a compressible sheet.

Accordingly, the composite joint piece with joint, electrically conductive and thermally conductive properties can provide slight deformability and eliminate the stress caused by the cooling and/or volume discrepancy between the back tube and the target material during the jointing and sputtering process, thereby decreasing the risk of cracking and/or breaking of the sputtering target and improving the sputtering power tolerance. Additionally, the electrically and thermally conductive adhesive can joint the target material and the back tube by filling the multiple through holes and thus enhances the joint strength, which reduces the risk of detachment between the back tube and the target material during the sputtering process.

Preferably, the joint piece is composed of the compressible structure adsorbed with the electrically and thermally conductive adhesive, and the electrically and thermally conductive adhesive is filled into the through holes and formed between the target material and the back tube.

Preferably, the compressible structure of the joint piece is electrically conductive, thermally conductive, and compressible. The material of the compressible structure may be, for example, a graphite blanket, a graphite sheet, a carbon blanket, a carbon sheet or any combination thereof.

Preferably, in one embodiment, the electrically and thermally conductive adhesive of the joint piece consists of thermosetting resin.

Preferably, in another embodiment, the electrically and thermally conductive adhesive of the joint piece comprises conductive particles and a thermosetting resin. The conductive particles may be, but are not limited to, aluminum particles, gold particles, silver particles, copper particles, zinc particles, iron particles, nickel particles or any combination thereof. The thermosetting resin may be, but is not limited to, an adhesive resin that contains epoxy resin. Accordingly, after the compressible structure adsorbed with the electrically and thermally conductive adhesive is disposed between the back tube and the target material, a simple heat step is enough to finish the whole jointing process and eventually achieve the objective of simplifying the process of the rotatable sputtering target.

Preferably, the content of the conductive particles ranges from 10 vol % to 60 vol % based on the volume of the electrically and thermally conductive adhesive.

For example, the electrically and thermally conductive adhesive may be any commercially available product, such as AF30 or EC1660 purchased from 3M or other products purchased from GE or Dow chemical company.

Preferably, the thermal conductivity of the joint piece is more than 20 W/m and the resistance of the joint piece is less than $5 \times 10^{-3}$ Ω·cm.

Preferably, the target material may be hollow and may be, but is not limited to, a ceramic material, a metal material, a metalloids material or a composite material, such as aluminum zinc oxide, indium gallium oxide, boron zinc oxide, molybdenum, niobium, silicon or any combination thereof.

Preferably, the back tube may be made of a high strength and high thermally conductive metal, such as, but not limited to, copper, copper-containing alloy, aluminum alloy (such as 6061), titanium or stainless steel.

According to the present invention, using the joint piece with electrically conductive, thermally conductive and compressible properties to joint the target material and the back tube not only simplifies the process of the rotatable sputtering target, but also ensures the target material is tightly jointed with the back tube. Meanwhile, the technical means of the present invention increases the sputtering power tolerance and further shortens the time of sputtering process and improve the sputtering efficiency.

Other objectives, advantages and novel features of the invention will become more apparent from the following detailed description when taken in conjunction with the accompanying drawings.

DETAILED DESCRIPTION OF THE PREFERRED EMBODIMENTS

Hereinafter, one skilled in the arts can easily realize the advantages and effects of a rotatable sputtering target in accordance with the present invention from the following examples. The descriptions proposed herein are just preferable embodiments for the purpose of illustrations only, not intended to limit the scope of the invention. Various modifications and variations could be made in order to practice or apply the present invention without departing from the spirit and scope of the invention.

Different materials of the joint piece to joint different materials of the target material and the back tube are adopted to prepare the rotatable sputtering targets of Examples 1 to 4 and Comparative Examples 1 to 6. The preparation methods of the rotatable sputtering targets of each Example and Comparative Example are presented as follows.

Examples 1 to 4

First, a back tube with 125 mm internal diameter, 133 mm external diameter and 1500 mm length was provided. The materials of the back tubes used in all Examples and Comparative Examples are listed in Table 1.

After that, a hollow target material with 142 mm internal diameter, 154 mm external diameter and 700 mm length was formed through sintering, casting, processing, etc. The materials of the target materials used in Examples and Comparative Examples are listed in Table 1. The hollow target material in Example 1 was made of indium tin oxide (ITO) through sintering and processing steps; the hollow target material in Example 2 was made of molybdenum through casting and processing steps; the hollow target material in Example 3 and Example 4 were made of silicon through crystal growth and machining steps.

Figure 1:
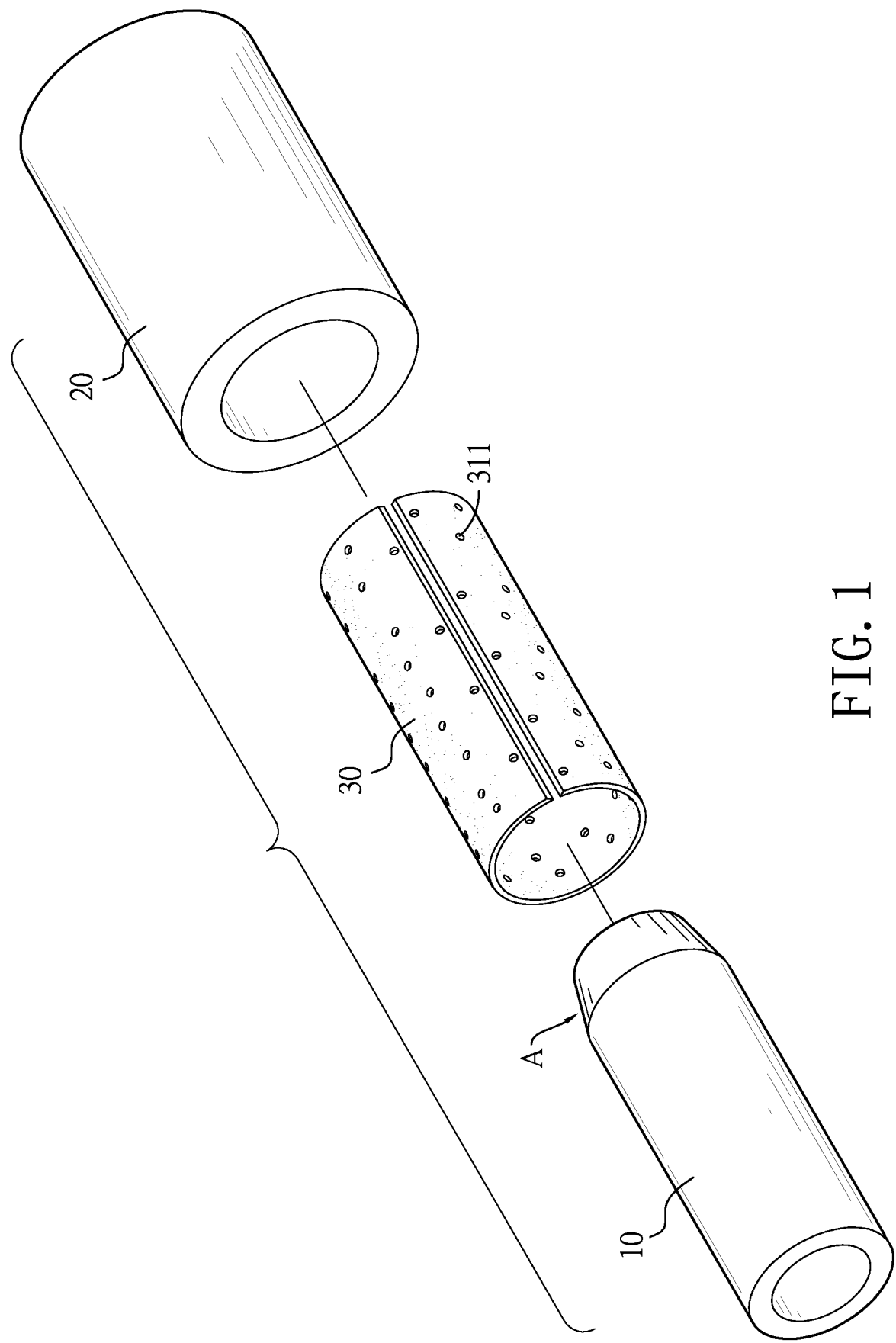
FIG. 1 is a schematic view of Examples 1 to 4, Comparative Example 5 and Comparative Example 6 of using an auxiliary tool to joint the back tube, the joint piece and the target material in accordance with the present invention.

Then, as shown in FIG. 1, the back tube 10 was installed on an auxiliary tool A before assembly. A graphite blanket 30 was first formed with multiple through holes 311 and then immersed into an electrically and thermally conductive adhesive solution, allowing the graphite blanket 30 to adsorb the electrically and thermally conductive adhesive. After that, the back tube 10 and the graphite blanket adsorbed with the electrically and thermally conductive adhesive (joint piece 30) were both mounted into the hollow target material 20. Afterward, an assembly containing the hollow target material 20, the joint piece 30 and the back tube 10 was heated to 250° C. to 450° C. for 5 minutes and then gradually cooled down to room temperature to obtain the rotatable sputtering target. The materials of the joint piece used in Examples are listed in Table 1.

More specifically, the electrically and thermally conductive adhesive in Example 1 was made of a thermosetting resin without a metal powder. In Example 2, the electrically and thermally conductive adhesive contained metal powders and a thermosetting resin, and it had 10 vol % to 60 vol % of aluminum or copper powders. In Examples 3 and 4, the electrically and thermally conductive adhesive contained graphite powders and a thermosetting resin.

Comparative Examples 1 to 2

First, a back tube with 125 mm internal diameter, 133 mm external diameter and 1500 mm length was provided. The materials of the back tubes used in Comparative Examples are listed in Table 1.

Then, a hollow target material with 142 mm internal diameter, 154 mm external diameter and 700 mm length was formed through sintering, casting, processing, etc. The materials of the target materials used in Comparative Examples are listed in Table 1. The hollow target material in Comparative Example 1 was made of aluminum zinc oxide (AZO) through sintering and processing steps, and the hollow target material in Comparative Example 2 was made of niobium through casting and processing steps.

Last, the hollow target material was inserted into the back tube and placed at 170° C. After that, the melted indium solder was introduced into the gap between the target material and the back tube. The assembly containing the hollow target material, the indium jointing material and the back tube was gradually cooled down to room temperature to obtain the rotatable sputtering target in Comparative Example 1 and Comparative Example 2.

Comparative Examples 3 to 4

First, a back tube with 125 mm internal diameter, 133 mm external diameter and 1500 mm length was provided. The materials of the back tubes used in Comparative Examples are listed in Table 1.

Then, a hollow target material with 142 mm internal diameter, 154 mm external diameter and 700 mm length was formed through sintering, casting, processing, etc. The materials of the target materials used in Comparative Examples are listed in Table 1. The hollow target material in Comparative Example 3 was made of niobium through sintering and processing steps, and the hollow target material in Comparative Example 4 was made of aluminum zinc oxide (AZO) through casting and processing steps.

Eventually, the hollow target material was inserted into the back tube and the electrically and thermally thermosetting resin containing 10 vol % to 60 vol % aluminum powders was introduced into the gap between the target material and the back tube (denoted as electrically and thermally conductive adhesive in Table 1). The assembly containing the hollow target material, the electrically and thermally conductive adhesive and the back tube was heated to 250° C. to 450° C. for 5 minutes and then gradually cooled down to room temperature to obtain the rotatable sputtering target in Comparative Example 3 and Comparative Example 4.

Comparative Examples 5 to 6

First, a back tube with 125 mm internal diameter, 133 mm external diameter and 1500 mm length was provided. The materials of the back tubes used in Examples and Comparative Examples are listed in Table 1.

After that, a hollow target material with 142 mm internal diameter, 154 mm external diameter and 700 mm length was formed through sintering, casting, processing, etc. The materials of the target materials used in Examples and Comparative Examples are listed in Table 1. The hollow target material in Comparative Example 5 was made of indium tin oxide (ITO) through sintering and processing steps, and the hollow target material in Comparative Example 6 was made of molybdenum through casting and processing steps.

Afterward, as shown in FIG. 1, the back tube 10 was installed on an auxiliary tool A before assembly. After that, the back tube 10 and the joint piece 30 were both mounted into the hollow target material 20 to obtain the rotatable sputtering target in Comparative Example 5 and Comparative Example 6. The materials of the joint pieces used in Examples and Comparative Examples are listed in Table 1.

TABLE 1 materials of the target material, the back tube and the joint piece of the rotatable sputtering target in Examples 1 to 4 and Comparative Example 1 to 6; and shearing tensile strength and maximum tolerable power of the rotatable sputtering target in Examples 1 to 4 and Comparative Examples 1 to 6.

| Sample No. | Material of Target material | Material of Back tube | Material of Joint piece | Shearing Tensile Strength (kg/cm$^2$) | Maximum Tolerable Power (kW/m$^2$) |
|---|---|---|---|---|---|
| Example 1 | ITO | Ti | Graphite blanket and electrically and thermally conductive adhesive | 21 | 20.2 |
| Example 2 | Mo | 304 stainless steel | Graphite blanket and electrically and thermally conductive adhesive | 21 | 21.7 |
| Example 3 | Si | 6061 | Graphite blanket and electrically and thermally conductive adhesive | — | 16.0 |
| Example 4 | Si | 304 stainless steel | Graphite blanket and electrically and thermally conductive adhesive | — | 18.0 |
| Comparative example 1 | AZO | 304 stainless steel | Indium solder | — | 12.2 |
| Comparative example 2 | Nb | Ti | Indium solder | — | 13.6 |
| Comparative example 3 | Nb | 304 stainless steel | Electrically and thermally conductive adhesive | 26 | 10.9 |
| Comparative example 4 | AZO | Ti | Electrically and thermally conductive adhesive | 25 | 9.1 |

TABLE 1-continued materials of the target material, the back tube and the joint piece of the rotatable sputtering target in Examples 1 to 4 and Comparative Example 1 to 6; and shearing tensile strength and maximum tolerable power of the rotatable sputtering target in Examples 1 to 4 and Comparative Examples 1 to 6.

| Sample No. | Material of Target material | Material of Back tube | Material of Joint piece | Shearing Tensile Strength (kg/cm$^2$) | Maximum Tolerable Power (kW/m$^2$) |
|---|---|---|---|---|---|
| Comparative example 5 | ITO | 304 stainless steel | Graphite blanket | — | 9.7 |
| Comparative example 6 | Mo | Ti | Graphite blanket | — | 11.0 |

Figure 2:
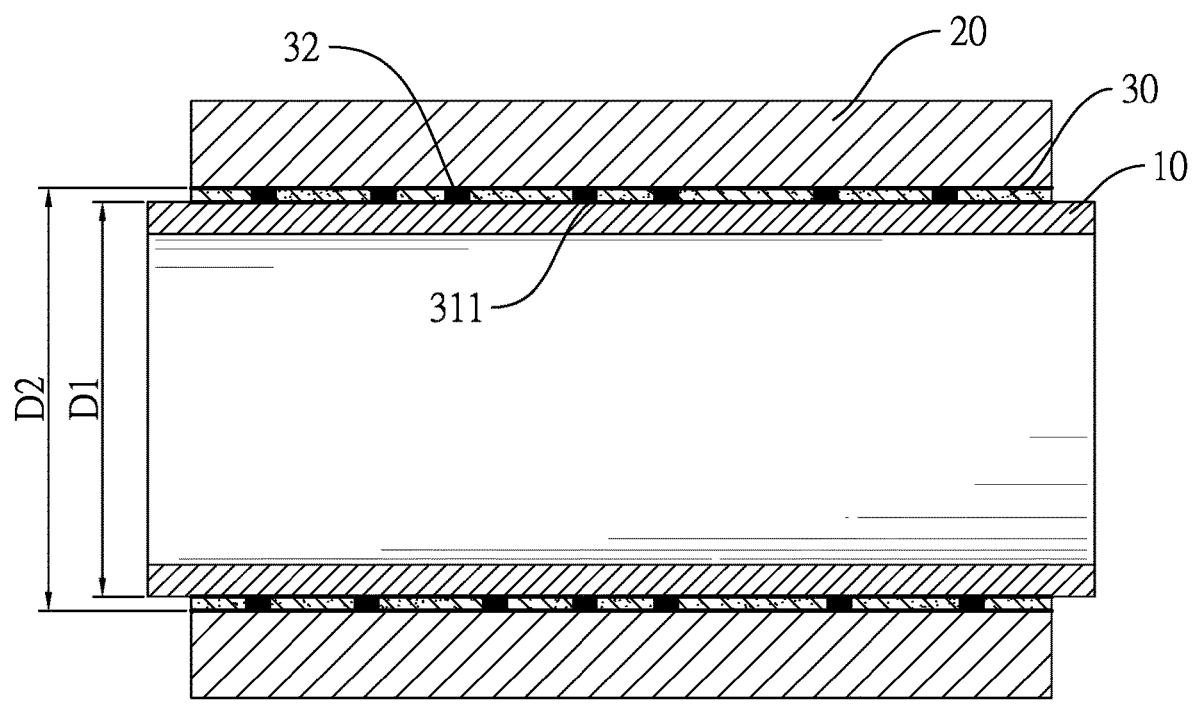
FIG. 2 is a cross-sectional view of the rotatable sputtering target in accordance with the present invention.
Figure 3:
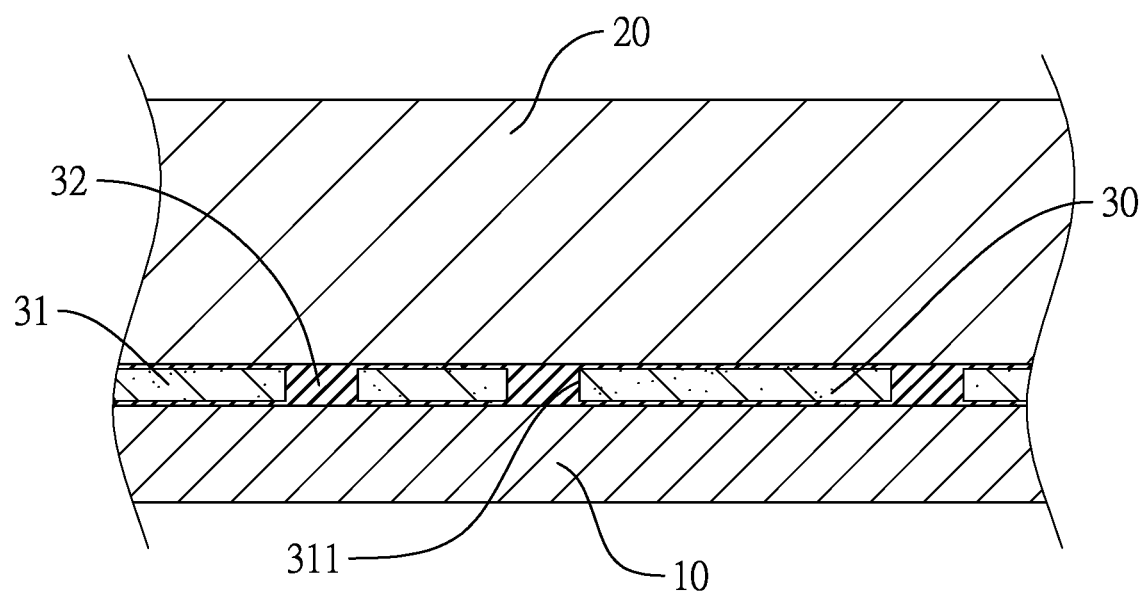
FIG. 3 is a cross-sectional view of the rotatable sputtering target in accordance with the present invention, shown with the electrically and thermally conductive adhesive directly jointing the target material and the back tube through the multiple through holes on the compressible structure.

According to the aforementioned preparation methods, the structure of the rotatable sputtering target in Examples and Comparative Examples is shown in FIGS. 2 and 3. The rotatable sputtering target had a back tube 10, a hollow target material 20 and a joint piece 30. The joint piece 30 was disposed between the back tube 10 and the target material 20 in order to joint the back tube 10 and the target material 20. Particularly, as shown in FIG. 3, the electrically and thermally conductive adhesive 32 was adsorbed on the entire surface of the compressible structure 31, formed between the target material 20 and the back tube 10 and filled in the multiple through holes 311 on the compressible structure 31 to joint the surface of the target material 20 and the back tube 10. The internal diameter D2 of the target material 20 was about 9 mm greater than the internal diameter D1 of the back tube 10 and the gap between the target material 20 and the back tube 10 was provided for an accommodation of the joint piece 30.

More particularly, in another embodiment, the electrically and thermally conductive adhesive 32 may be directly formed between the target material 20 and the back tube 10 by filling the through holes 311.

Test Example 1: Joint Strength

The rotatable sputtering targets of Examples 1 to 2 and Comparative Examples 3 to 4 were chosen for testing. Each chosen rotatable sputtering target was sliced to conduct a shear test for evaluating the joint strength, also called shearing tensile strength. The cross-sectional structure for testing each sample was illustrated in FIG. 4.

The length and the width of each sample were respectively 166 mm and 10 mm, wherein the length and the thickness of the hollow target material and the back tube were respectively 83 mm and 3 mm; the length and the thickness of the joint piece were respectively 20 mm and 4.5 mm.

Figure 4:
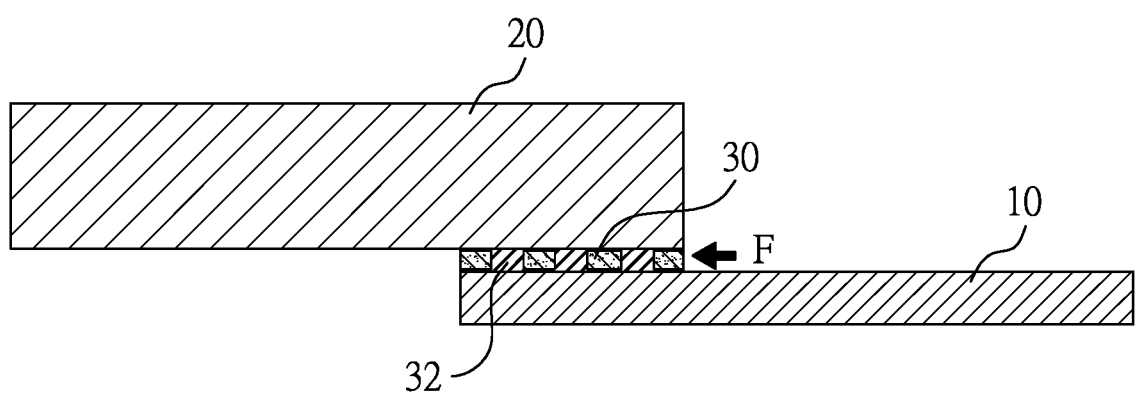
FIG. 4 is a cross-sectional view of the rotatable sputtering target in accordance with the present invention, shown with sample undergoing a shear test.

Afterward, as shown in FIG. 4, two ends of each sample were clamped by two jigs of a universal testing machine, i.e., one end of the sample was at the end of the back tube 10 and the other end of the sample was set at the end of the target material 20. One of the ends of the sample was pulled by a force F at 50 mm/min rate meanwhile the other end was fixed. When the sample was ruptured, the shearing tensile strength was recorded and the results were listed in Table 1.

As shown in Table 1, whether the ceramic sputtering target in Example 1 or the metal sputtering target in Example 2, the joint strength of the sputtering target using the graphite blanket and electrically and thermally conductive adhesive as materials of the joint piece was comparable to those in Comparative Examples 3 and 4. According to the experimental results, choosing the graphite blanket and electrically and thermally conductive adhesive as materials of the joint piece still could effectively joint the target material and the back tube for obtaining the sputtering target with good joint property.

Test Example 2: Maximum Tolerable Power

The rotatable sputtering targets of Examples 1 to 4 and Comparative Examples 5 to 6 were chosen for testing. Each chosen rotatable sputtering target was placed in a sputtering room. The sputtering room contained a DC power supply, a grounding shield, a gas inlet, a vacuum pump and a foundation that could be placed with a substrate. Upon sputtering, the sputtering target was connected to the cathode and the substrate was placed in the sputtering room. Then, after argon gas with flow 20 sccm was pumped into the sputtering room, sputtering process was conducted with 100 W to 1500 W DC power under 5 mtorr.

After that, the sputtering power was gradually increased within the aforementioned range. When the back tube could not simultaneously spin with the target material due to the detachment or rupture of the target material, the specific DC power was recorded. The specific DC power divided with the area of the target material equaled the maximum tolerable power of the rotatable sputtering target.

As shown in Table 1, whether the ceramic sputtering target in Example 1, the metal sputtering target in Example 2 or the metalloids sputtering target in Examples 3 and 4, the maximum tolerable power of the sputtering target using the graphite blanket and electrically and thermally conductive adhesive as materials of the joint piece was higher than that in Comparative Examples 1 to 6. Accordingly, the maximum tolerable power of the rotatable sputtering target in Examples 1 and 4 was obviously higher than those in Comparative Examples 1 to 6. Particularly, the maximum tolerable power of the rotatable sputtering target in Examples 1 and 2 was significantly higher than those in Comparative Examples 1 and 2.

In conclusion, using the graphite blanket and electrically and thermally conductive adhesive as the materials of the joint piece not only maintains the joint strength between the target material and the back tube but also largely improves the tolerable power during sputtering of the rotatable sputtering target, thereby increasing the sputtering efficiency and prolonging the life time of the rotatable sputtering target.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A rotatable sputtering target comprising:
a target material;
a back tube;
a joint piece disposed between the target material and the back tube;
the joint piece comprising a compressible structure and an electrically and thermally conductive adhesive;
the compressible structure being a graphite blanket, a graphite sheet or a combination thereof and having multiple through holes, and the electrically and thermally conductive adhesive adsorbed on the entire surface of the compressible structure, formed between the target material and the back tube and filled in the through holes.

2. The rotatable sputtering target as claimed in claim 1, wherein the joint piece is composed of the compressible structure adsorbed with the electrically and thermally conductive adhesive, and the electrically and thermally conductive adhesive is filled into the through holes and formed between the target material and the back tube.

3. The rotatable sputtering target as claimed in claim 1, wherein the thermal conductivity of the joint piece is more than 20 W/m.

4. The rotatable sputtering target as claimed in claim 1, wherein the resistance of the joint piece is less than $5 \times 10^{-3}$ Ω·cm.

5. The rotatable sputtering target as claimed in claim 1, wherein the electrically and thermally conductive adhesive of the joint piece consists of a thermosetting resin.

6. The rotatable sputtering target as claimed in claim 1, wherein the electrically and thermally conductive adhesive of the joint piece comprises multiple conductive particles and a thermosetting resin; the content of the conductive particles ranges from 10 vol % to 60 vol %.

7. The rotatable sputtering target as claimed in claim 6, wherein the conductive particles are aluminum particles, gold particles, silver particles, copper particles, zinc particles, iron particles, nickel particles or any combination thereof.

8. The rotatable sputtering target as claimed in claim 1, wherein the target material is made of a ceramic material, a metal material, a metalloids material or a composite material.

9. The rotatable sputtering target as claimed in claim 2, wherein the target material is made of a ceramic material, a metal material, a metalloids material or a composite material.

10. The rotatable sputtering target as claimed in claim 3, wherein the target material is made of a ceramic material, a metal material, a metalloids material or a composite material.

11. The rotatable sputtering target as claimed in claim 4, wherein the target material is made of a ceramic material, a metal material, a metalloids material or a composite material.

12. The rotatable sputtering target as claimed in claim 5, wherein the target material is made of a ceramic material, a metal material, a metalloids material or a composite material.

13. The rotatable sputtering target as claimed in claim 1, wherein a material of the back tube is copper, copper-containing alloy, aluminum-containing alloy, titanium or stainless steel.

14. The rotatable sputtering target as claimed in claim 2, wherein a material of the back tube is copper, copper-containing alloy, aluminum-containing alloy, titanium or stainless steel.

15. The rotatable sputtering target as claimed in claim 3, wherein a material of the back tube is copper, copper-containing alloy, aluminum-containing alloy, titanium or stainless steel.

16. The rotatable sputtering target as claimed in claim 4, wherein a material of the back tube is copper, copper-containing alloy, aluminum-containing alloy, titanium or stainless steel.

17. The rotatable sputtering target as claimed in claim 5, wherein a material of the back tube is copper, copper-containing alloy, aluminum-containing alloy, titanium or stainless steel.

* * * * *